United States Patent

Youens et al.

[11] Patent Number: 6,058,089
[45] Date of Patent: May 2, 2000

[54] EXTERNAL FLOPPY DRIVE WITH SECURE STORAGE OF A CABLE AND CONNECTOR FOR CONNECTING TO A COMPUTER SYSTEM

[75] Inventors: John E. Youens, Magnolia, Tex.; Ryuichi Negishi, Chichibu, Japan; Toru Okada, Kumagaya, Japan; Hitoshi Kurihara, Morii-machi, Japan

[73] Assignee: Compaq Computer Corporation, Houston, Tex.

[21] Appl. No.: 08/370,939

[22] Filed: Jan. 10, 1995

Related U.S. Application Data

[63] Continuation-in-part of application No. 29/018,030, Jan. 27, 1994, Pat. No. Des. 366,472, and application No. 08/010,020, Jan. 27, 1993, and application No. 08/189,487, Jan. 31, 1994.

[51] Int. Cl.[7] .............................. G11B 33/02; G06F 1/16; H01R 13/60
[52] U.S. Cl. .......................... 369/75.1; 439/528; 361/684
[58] Field of Search ........................... 369/75.1; 439/502, 439/638, 528; 361/683–686, 736, 737, 789; 360/97.01

[56] References Cited

U.S. PATENT DOCUMENTS

| | | | |
|---|---|---|---|
| 5,033,474 | 7/1991 | Varelis et al. | 128/696 |
| 5,132,871 | 7/1992 | Densham et al. | 361/685 |
| 5,153,817 | 10/1992 | Hosoi et al. | 361/685 |

*Primary Examiner*—George J. Letscher
*Attorney, Agent, or Firm*—Sharp, Comfort & Merrett, P.C.

[57] ABSTRACT

An external peripheral device connects through a flexible cable to an electrical connector which connects to a computer system. The flexible cable wraps around a cable wrap member that protrudes out of the peripheral device's housing, and the electrical connector snaps into a connector holder built into the peripheral device's housing. The cable wrap member and the connector holder permit the secure storage of the flexible cable and electrical connector during non-use or transportation of the device.

18 Claims, 2 Drawing Sheets

EXTERNAL FLOPPY DRIVE WITH SECURE STORAGE OF A CABLE AND CONNECTOR FOR CONNECTING TO A COMPUTER SYSTEM

This is a continuation-in-part of copending applications Ser. No. U.S. Design Pat. No. D366,472, filed Jan. 27, 1994; and Ser. No. 08/010,020, filed Jan. 27, 1993; and Ser. No. 08/189,487, filed Jan. 31, 1994.

BACKGROUND OF THE INVENTION

This invention relates to external peripheral devices for personal computer systems. More specifically, this invention relates to external peripheral devices having a cable and a connector for connecting to a personal computer system.

As the drive to make personal computer systems smaller and smaller continues, some compromises have to be made in what devices get included inside the computer housing, itself. Certain components are still considered to be required elements within the computer. For example, a central processing unit, a main memory, bus connections and some form of mass data storage are found within almost all personal computer systems. Of course, the mass data storage component, usually a hard disk drive, may actually be left out of some desktop personal computer systems where it is possible to boot the computer from a network connection. For notebook personal computer systems, however, the computer must be a complete all-in-one unit. Thus, it is essential to have the hard drive, along with each and every element, including even a battery for providing the computer with its own power, within the housing of the computer. As such, it is very difficult to find components to take out of a notebook computer. Nevertheless, many notebook computer makers have determined that the floppy drive is not an essential element within the actual computer housing, so they have created external floppy drives for some notebook computer systems. These notebook computer systems are so small they are termed subnotebooks.

These external floppy drives are typically connected to the subnotebook by a cable to a special connector located on an external surface of the subnotebook. This connector may be a specially designated connector, or it may be a standard connector, such as a parallel or serial port that can double as the interface for the external floppy drive.

An external floppy drive usually requires a cable to connect to the computer system. This cable, if it is too long, can be rather unwieldy and difficult to manage when storing the external drive in a small case or just when carrying the device around. In fact, the dangling cable can be quite an annoyance. Some users may wrap the cable around the floppy drive, itself, but this means of storing the cable can be just a unwieldy as leaving the cable free to dangle wherever, since the connector at the end of the cable is still loose. If the cable, on the other hand, is too short, it may be difficult to position the drive in a usable place beside the computer during use. Thus, a need has arisen for some means to store the cable and the connector in an unobtrusive manner.

SUMMARY OF THE INVENTION

An external peripheral device according to the invention has a cable wrap member around which the flexible cable is wrapped during storage of the device. Additionally, the external peripheral device has a connector holder for securely holding the connector. The connector is preferably a PCMCIA connector card, but it is conceivable that other connectors could be used with this invention.

The cable wrap member protrudes from the rear end of the external peripheral device, and the flexible cable wraps around this protrusion. Flange members attach to the free end of the protrusion, so the flexible cable is held in place on the protrusion by the flange members and the housing of the external peripheral device.

The connector holder is a lowered space in the top surface of the external device into which the PCMCIA connector card fits snugly. Small lips on the top surface of the external device protrude out over the connector holder space in order to hold the PCMCIA connector card in place. In order to prevent the PCMCIA connector card from rattling around in the connector holder space, a spring on one side of the lowered space presses the connector card up against the other side of the lowered space. This spring, in combination with the small lips, hold the PCMCIA connector card securely in the connector holder space.

Although this invention is disclosed in connection with an external floppy disk drive connected through a PCMCIA connector, it is contemplated that the invention could be equally applied to an external hard drive, external CD ROM drive, external modem, or any other device which could be connected externally to the computer system through an external port.

BRIEF DESCRIPTION OF THE DRAWINGS

A better understanding of the present invention may be obtained when the detailed description of the preferred embodiments is considered in conjunction with the following drawings, in which.

DETAILED DESCRIPTION OF THE PREFERRED EMBODIMENTS

Figure 1:
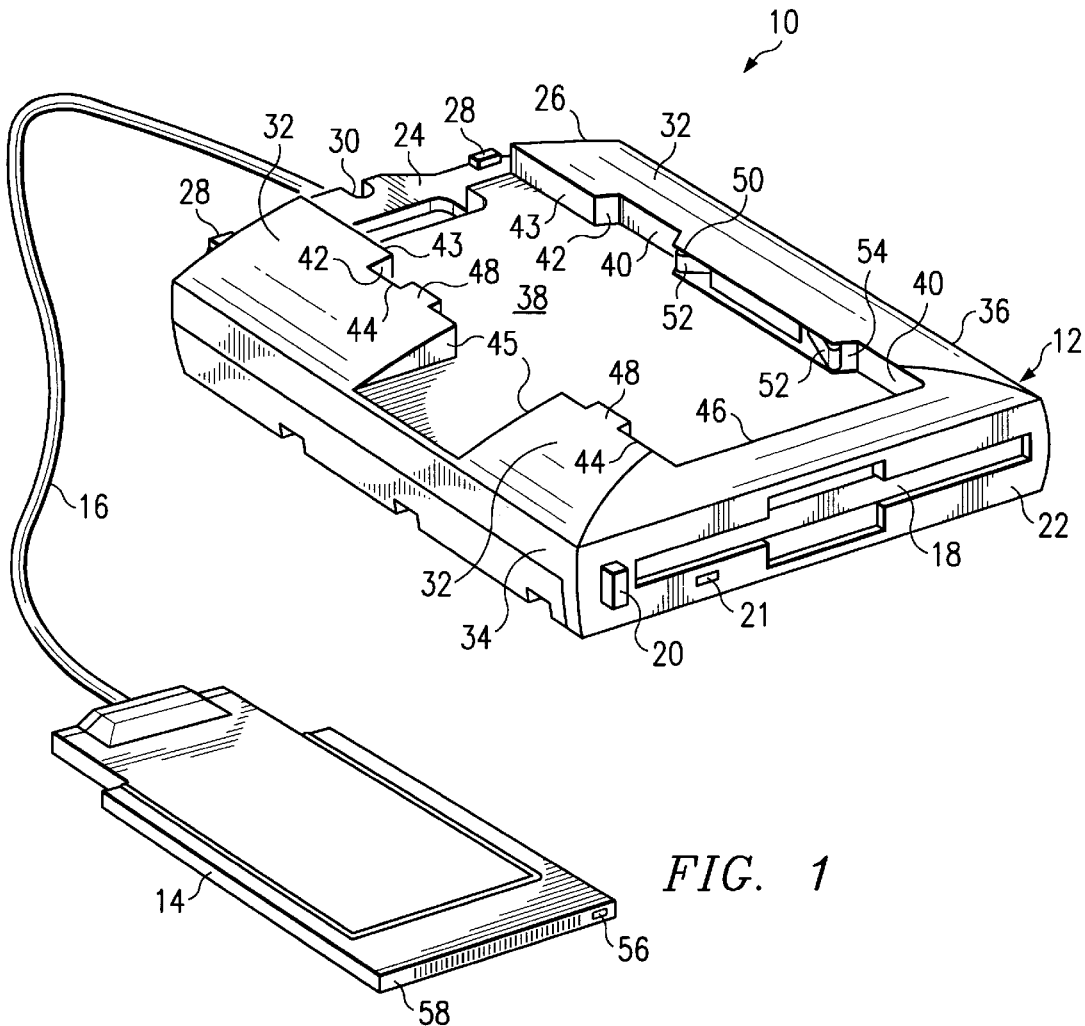
FIG. 1 is a perspective view of an external floppy drive according to the present invention.

Referring to FIGS. 1–4, an external floppy disk drive 10 is shown with a housing 12 connected to a PCMCIA connector card 14 by a flexible cable 16. A floppy disk bay door 18, a floppy disk ejector button 20 and a floppy disk drive activity LED 21 are located on the front face 22 of the housing 12. Although this invention will be described with reference to the external floppy disk drive 10 and the PCMCIA connector card 14, it is contemplated that the invention applies to other external peripheral devices and other connection devices. For example, other external peripherals could include an external CD ROM drive. In which case, the floppy drive bay door 18 would be replaced with a CD ROM drive bay door. Another external peripheral could include an external hard drive. In which case, there would be no bay door, since a hard drive requires no removable media. Yet another external peripheral could be a modem. As for the connector device, the invention could apply to a parallel or serial port connector as well as to a PCMCIA connector. As such, the above list of external devices and connector devices is not intended to be all inclusive.

The housing 12 has a cable wrap member 24 that protrudes out of the rear face 26 of the housing 12. Flanges 28 connect to the free end of the protruding cable wrap member 24. A cable notch 30 in the middle of the protruding cable wrap member 24 receives the flexible cable 16 (see FIGS. 2–4).

The housing 12 also has a top surface 32 that curves upwardly and inwardly from the front 22 and side faces 34, 36. In roughly the center of the top surface 32 is a flat lowered space 38 that is only slightly larger than the dimensions of the PCMCIA connector card 14. The lowered space 38 is bounded by walls 40, 42, 43, 44, 45 and 46. Most of wall 42 is open to permit lowered space 38 to extend to the rear face 26 of the housing 12 bounded by walls 43. Likewise, part of wall 44 is open to permit lowered space 38 to extend almost to side face 34 bounded by walls 45. Two small lips 48 extend from the top surface 32 of the housing 12 above the wall 44 out over the lowered space 38. Additionally, another lip 50 extends from the top surface 32 of the housing 12 above the wall 40 out over the lowered space 38. Springs 52 protrude out through an opening 54 in wall 40 under lip 50.

The PCMCIA connector card 14 has two rows of small connector pin holes 56 arrayed on its front surface 58 for connection to matching pins on a connector slot in a computer system (not shown).

Figure 2:
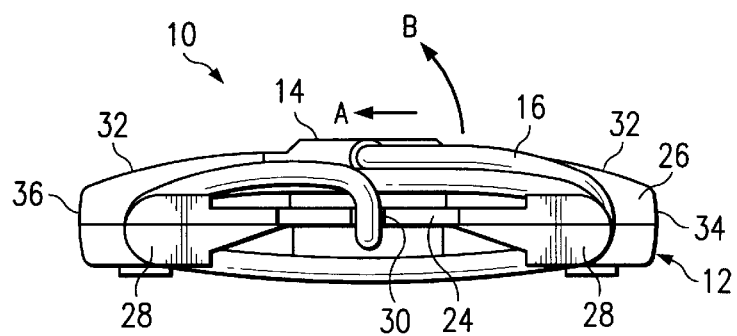
FIG. 2 is a rear view thereof with the flexible cable and PCMCIA connector card securely stored.
Figure 3:
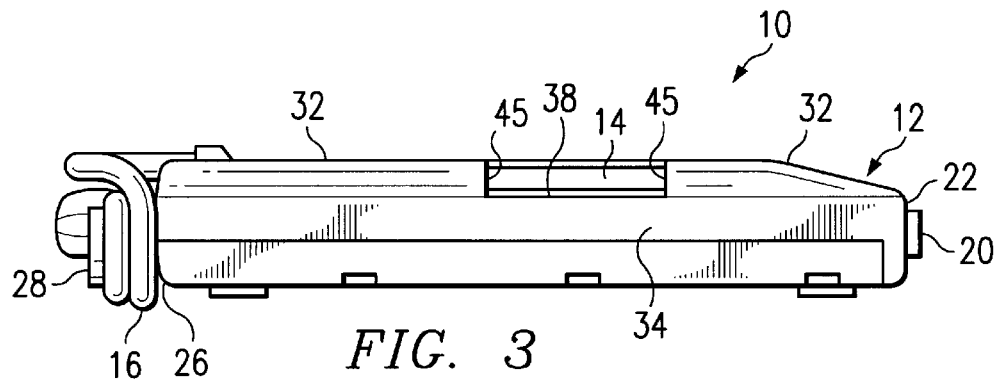
FIG. 3 is a side view thereof.
Figure 4:
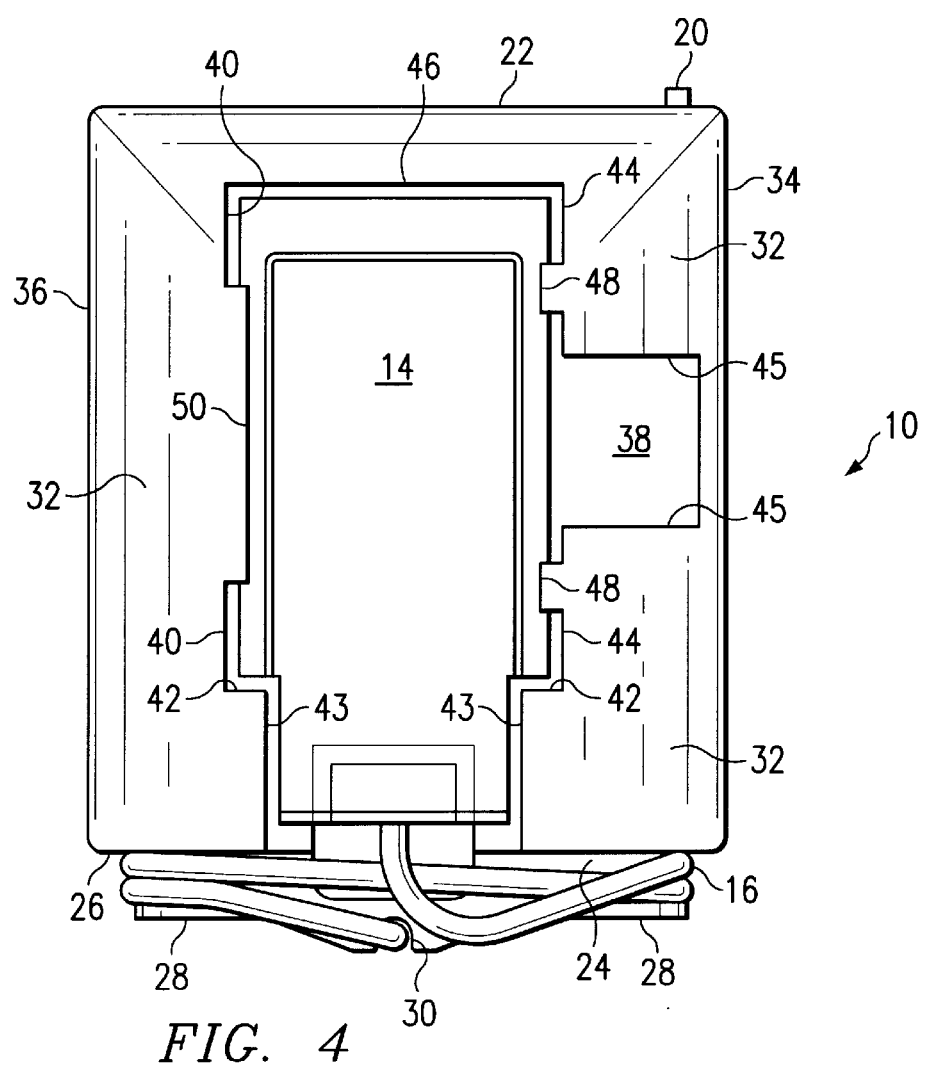
FIG. 4 is a top view thereof.

The flexible cable 16 wraps around the cable wrap member 24 as seen in FIGS. 2–4. The drawings show the cable 16 inserted in the cable notch 30 near the housing end of the cable 16, but the cable 16 could be held in the cable notch 30 near the PCMCIA connector end of the cable 16 according to the user's preference. Either way, the flexible cable 16 is held in cable notch 30 to prevent unnecessary bending stresses on the joint between the cable 16 and either the housing 12 or the PCMCIA connector card 14.

The PCMCIA connector card 14 fits into the lowered space 38 as seen in FIG. 4. The opening in wall 42 that permits the lowered space 38 to extend to the rear face 26 also permits an access for the flexible cable 16. Lips 48 and 50 hold the PCMCIA connector card 14 down, and springs 52 press the PCMCIA connector card against wall 44. Together, the lips 48 and 50 and the springs 52 hold the PCMCIA connector card 14 securely in place in the lowered space 38 such that the lips 48 and 50, the walls 40, 42, 43, 44, 45 and 46, the springs 52 and the lowered space 38 form a PCMCIA connector card holder.

The combination of the cable 16 wrapped around the cable wrap member 24 and the PCMCIA connector card 14 held in the connector card holder provides a convenient way to secure the entire housing/cable/connector unit for easy storage and transportation. The opening in wall 44 that permits the lowered space 38 to extend almost to the side face 34 also permits the user to use a finger to push the PCMCIA connector card 14 in the direction of arrow A (FIG. 2) against the springs 52. The side of the PCMCIA connector card 14 will clear the lips 48, so that the user can then lift and rotate the PCMCIA connector card 14 in the direction of arrow B, thus removing the connector 14 from the connector holder. Replacing the connector 14 in the connector holder is done in simply the opposite manner.

This invention has been described in terms of particular embodiments. Obviously, modifications and alterations will be apparent to those skilled in the art in view of this disclosure, including, but not limited to the shape or type of the connector and the particular external peripheral device. It is therefore intended that all such equipments, variations, and modifications fall within the spirit and scope of the invention as claimed.

What is claimed is:

1. An external peripheral device for use with a computer system comprising:

a housing;

an electrical connector means for electrically connecting the external peripheral device to the computer system;

a flexible cable for connecting the external peripheral device to the electrical connector means; and a cable wrap means having a protruding portion projecting from said housing around which said flexible cable wraps when the external peripheral device is not connected to the computer system;

whereby said flexible cable is securely stored; and a connector holder for holding said electrical connector when the external peripheral device is not connected to the computer system, whereby said electrical connector is securely stored during non-use of the external peripheral device.

2. The external peripheral device of claim 1 further comprising:

a housing having a substantially rectangular top surface, a first side edge, a second side edge, a front edge and a rear edge;

said top surface having a substantially rectangular, substantially flat lowered portion with edges offset from said first side edge, said second side edge, said front edge and said rear edge, said edges of said lowered portion forming walls extending from said lowered portion up to said top surface;

a first lip extending over said lowered portion from the top of said wall formed from said lowered portion edge offset from said first side edge;

a second lip extending over said lowered portion from the top of said wall formed from said lowered portion edge offset from said second side edge;

said lowered portion, said walls and said first and said second lips forming said connector holder;

whereby said electrical connector is held securely in said connector holder above said lowered portion, between said walls, and below said first and said second lips.

3. The external peripheral device of claim 3 further comprising:

a spring means disposed within an opening in said wall offset from said second side edge for engaging said electrical connector under said second lip and biasing said electrical connector under said first lip against said wall offset from said first side edge.

4. The external peripheral device of claim 1 wherein said external peripheral device is an external floppy disk drive.

5. The external peripheral device of claim 1, further comprising:

a flange member protruding from a free end of said cable wrap means for preventing said flexible cable from slipping off of said free end when said flexible cable is wrapped around the protruding portion of said cable wrap means.

6. The external peripheral device of claim 1, further comprising:

a notch formed on a free end of said cable wrap means to hold the cable and reduce bending.

7. The external peripheral device of claim 1, wherein said external peripheral device is a disk drive.

8. The external peripheral device of claim 1, wherein said external peripheral device is a modem.

9. The external peripheral device of claim 1, wherein said external peripheral device is a compact disk read-only-memory (CD-ROM).

10. An external peripheral device for use with a computer system comprising:

a housing;

an electrical connector for electrically connecting the external peripheral device to the computer system;

a flexible cable for connecting the external peripheral device to the electrical connector; and a cable wrap member having a protruding portion projecting from said housing around which said flexible cable wraps when the external peripheral device is not connected to the computer system; and a connector holder for holding said electrical connector when the external peripheral device is not connected to the computer system, whereby said electrical connector is securely stored during non-use of the external peripheral device.

11. The external peripheral device of claim 10 further comprising:

said housing having a substantially rectangular top surface, a first side edge, a second side edge, a front edge and a rear edge;

said top surface having a substantially rectangular, substantially flat lowered portion with edges offset from said first side edge, said second side edge, said front edge and said rear edge, said edges of said lowered portion forming walls extending from said lowered portion up to said top surface;

a first lip extending over said lowered portion from the top of said wall formed from said lowered portion edge offset from said first side edge;

a second lip extending over said lowered portion from the top of said wall formed from said lowered portion edge offset from said second side edge;

said lowered portion, said walls and said first and said second lips forming said connector holder;

whereby said electrical connector is held securely in said connector holder above said lowered portion, between said walls, and below said first and said second lips.

12. The external peripheral device of claim 10 further comprising:

a spring disposed within an opening in said wall offset from said second side edge for engaging said electrical connector under said second lip and biasing said electrical connector under said first lip against said wall offset from said first side edge.

13. The external peripheral device of claim 11 wherein said external peripheral device is an external floppy disk drive.

14. An external peripheral device for use with a computer system comprising:

a housing;

an electrical connector for electrically connecting the external peripheral device to the computer system;

a flexible cable for connecting the external peripheral device to the electrical connector; and a cable wrap member having a protruding portion projecting from said housing around which said flexible cable wraps when the external peripheral device is not connected to the computer system;

a flange member protruding from a free end of said cable wrap member for preventing said flexible cable from slipping off of said free end when said flexible cable is wrapped around the protruding portion of said cable wrap member; and a connector holder for holding said electrical connector when the external peripheral device is not connected to the computer system, whereby said electrical connector is securely stored during non-use of the external peripheral device.

15. The external peripheral device of claim 10, further comprising:

a notch formed on a free end of said cable wrap member to hold the cable and reduce bending.

16. The external peripheral device of claim 10, wherein said external peripheral device is a disk drive.

17. The external peripheral device of claim 10, wherein said external peripheral device is a modem.

18. The external peripheral device of claim 10, wherein said external peripheral device is a compact disk read-only-memory (CD-ROM).

* * * * *